United States Patent [19]

Elmer

[11] 4,024,509
[45] May 17, 1977

[54] CCD REGISTER ARRAY ADDRESSING SYSTEM INCLUDING APPARATUS FOR BY-PASSING SELECTED ARRAYS

[75] Inventor: Ben R. Elmer, Glendale, Ariz.

[73] Assignee: Honeywell Information Systems, Inc., Phoenix, Ariz.

[22] Filed: June 30, 1975

[21] Appl. No.: 592,155

[52] U.S. Cl. ............... 340/172.5; 340/173 R; 340/173 BB

[51] Int. Cl.² ............... G06F 13/00; G11C 7/00; G11C 19/00

[58] Field of Search ...... 340/172.5, 173 R, 173 BB, 340/173 SP; 307/238

[56] References Cited

UNITED STATES PATENTS

| | | | |
|---|---|---|---|
| 3,346,850 | 10/1967 | Wehrig | 340/172.5 |
| 3,543,247 | 11/1970 | Schrem | 340/172.5 |
| 3,609,704 | 9/1971 | Schurter | 340/172.5 |
| 3,641,511 | 2/1972 | Cricchi et al. | 340/173 R |
| 3,681,763 | 8/1972 | Meade et al. | 340/173 R |
| 3,753,238 | 8/1973 | Tutelman | 340/172.5 |
| 3,781,826 | 12/1973 | Beausoleil | 340/173 R |
| 3,851,313 | 11/1974 | Chang | 340/173 R |
| 3,881,175 | 4/1975 | Wanlass | 340/173 R X |
| 3,882,470 | 5/1975 | Hunter | 340/173 R |

*Primary Examiner*—Melvin B. Chapnick
*Attorney, Agent, or Firm*—William W. Holloway, Jr.; Ronald T. Reiling; Nicholas Prasinos

[57] ABSTRACT

A serial addressing system for arrays. Each array is comprised of a plurality of charge coupled device (CCD) registers. All of the registers comprising an array are addressed simultaneously, but only one of $n$ arrays is accessed at a time. A serial address forming a stream of up to $n$ bits containing only one 1 bit is propagated through address circuits for $n$ array. The final position of the 1-bit determines which of the $n$ arrays is accessed. Only the address circuits for properly functioning arrays form the bits of an $n$-bit address shift register, whereas the address circuits for improperly functioning arrays are shorted such that they do not form bits of the $n$-bit address shift register.

26 Claims, 7 Drawing Figures

CCD REGISTER ARRAY ADDRESSING SYSTEM INCLUDING APPARATUS FOR BY-PASSING SELECTED ARRAYS

RELATED APPLICATIONS

The following applications assigned to the same assignee named herein are incorporated by referenece to the instant application:

No. 1. "Muliphase Series-Parallel-Series Charge Coupled Device Registers" invented by Ben R. Elmer et al. Ser. No. 592,156, filed on June 30, 1975.

No. 2. "Muliphase Series-Parallel-Series Charge Coupled Device Registers With Simplified Input Clocking" invented by Ben R. Elmer et al. Ser. No. 591,724 filed on June 30, 1975.

No. 3. "Charge Injectors For CCD Registers" invented by Wallace E. Tchon, Ser. No. 592,147 filed on June 30, 1975.

No. 4. "Charge Detectors For CCD Registers" invented by Ben R. Elmer and Wallace E. Tchon, Ser. No. 591,667, filed on June 30, 1975.

No. 5. "CCD Register Interface With PARTIAL-WRITE Mode", invented by Ben R. Elmer and Wallace E. Tchon, Ser. No. 591,723, filed on June 30, 1975.

No. 6. "Fault-Tolerant CCD Memory Chip", invented by Ben R. Elmer, et al., Ser. No. 591,666, filed on June 30, 1975.

BACKGROUND OF THE INVENTION

1. Field of the Invention

This invention relates generally to serial addressing of memory chips and in particular to a method and apparatus for using a chain selection scheme in a fault-tolerant mode for addressing a plurality of arrays, each of which contains a plurality of serial registers, on CCD chips.

2. Description of the Prior Art

In order to effectively utilize CCD technology, high density must be obtained. The smallest possible cell sites for storage of charge is desirable, as well as an optimum spacial configuration of cell sites forming a register in order to achieve the high density. In practical applications of CCDs, the density problem is present not only at a configurational level within the register, but also with respect to control circuitry for interfacing between the registers and the remainder of the data processing system. High density CCD storage registers are described in Related Application Nos. 1 and 2. Injector, sense amplifier, and interface circuitry for each register are described in Related Application Nos. 3, 4, and 5 respectively.

In order to achieve the desired density levels, concern for minimization of spacial requirements must extend to a configurational level beyond that of the register. For example, registers may advantageously be grouped in parallel to form arrays. Whenever, an array is accessed, all of the registers work in parallel, that is, they READ, WRITE or REFRESH simultaneously over a plurality of data buses. In this manner, control circuitry is used for a plurality of registers and is thereby minimized, increasing the effective density of the CCD chip containing the registers. Such a high chip configuration and associated control circuitry is described in Related Application No. 6. In this manner, a chip receives an address corresponding to a single array and proceeds to address in parallel the plurality of registers comprising that array. Each of the registers then transmits the data within it serially, since the CCD registers are serial storage devices. Requirements of such a system therefore include an addressing scheme for the arrays on the chips forming a memory module.

Whenever data is to be accessed (read) or stored (written), it is necessary to address the memory area where the date is, or is to be, stored. This requires some form of addressing scheme. Two basic types of addressing schemes are serial and parallel. Serial addressing requires only one lead or wire to the storage unit. However, data bits transmitted over this lead must be multiplexed over time, and before their usage as an address, they generally require some form of demultiplexing. Serial addressing offers advantages of simplicity of design, and lesser area and power requirements. However, it is generally a relatively slow method, since it requires transmission of the address bit-by-bit, until all of the address bits have been transmitted.

Parallel addressing requires a plurality of leads for simultaneous transmission of bits over these leads. In this manner, the address is rapidly transmitted to the memory area. However, since many lines are required, much space as well as additional power to transmit all of these bits in parallel is required.

Once an address is transmitted to a memory area, whether it be by serial or parallel method, this address must be used in some way to determine which area within the memory is to be accessed. Prior art methods utilized stored addresses for each storage area. For example, each array had a stored address uniquely corresponding to that array. This stored address was compared to the input address to determine if they were the same. If so, the array corresponding to this stored address was accessed. However, this method required not only holding of stored addresses, but also a holding area for the input address, and a comparator for operating on the two addresses. All these requirements obviously add to the spacial requirments of embodiments for this method.

Most prior art addressing schemes assume that all parts of the memory system whether it be on a chip or some other form of system, are 100% operational. In this manner, each area is assumed to have a unique address and each address corresponds to a working and utilizable data area. However, at a chip level, 100% working capability of storage parts implies a very high processing cost for chips. If a chip could contain areas, such as arrays, some of which were defective, substantial cost savings could result. However, this would require a fault-tolerant addressing scheme, that is, one which avoided the malfunctioning arrays. There are, in general, two ways of avoiding addressing of defective storage areas. One is by software control. However, this requires storing the addresses corresponding to defective storage areas in some part of the system and then comparing an address to this stored address in order to avoid addressing of a defective area. Clearly, this is a slow and costly way of achieving fault-tolerance, A more desirable way is by a hardware scheme which automatically prevents addressing of the defective areas.

OBJECTS OF THE INVENTION

It is an object of the present invention therefore to provide a serial addressing scheme and circuits for achieving same for addressing arrays on a chip.

It is another object of the present invention to provide an addresssing system which requires a minimum of area and power.

It is yet another object of the present invention to provide an addressing system which does not require storing and comparing addresses and means for accomplishing same.

It is still another object of the present invention to provide a fault-tolerant addressing system which allows for defective areas within a chip by avoiding addressing of said defective areas by hardware means.

Other objects and benefits of the present invention will become more apparent to those ordinary skill in the art when read in conjunction with the drawings contained herein.

SUMMARY OF THE INVENTION

The addressing system of the present invention is designed to select 1 of n arrays. The input address is a stream of data bits, containing up to $n-1$ 0 s and exactly one 1. Positioning of the 1 bit corresponds to identifying the array to be addressed.

Address circuits for each array each comprise a 1—bit address storage register. N address circuits are coupled so as to form an n—bit serial address shift register, which propagates and stores the input address.

The address circuits are also provided with means for testing each array during manufacture to determine if it is properly functioning. If so, a chain fuse is broken, thereby making the address circuit part of the n—bit address shift register.

DESCRIPTION OF THE PREFERRED EMBODIMENT

Figure 1:
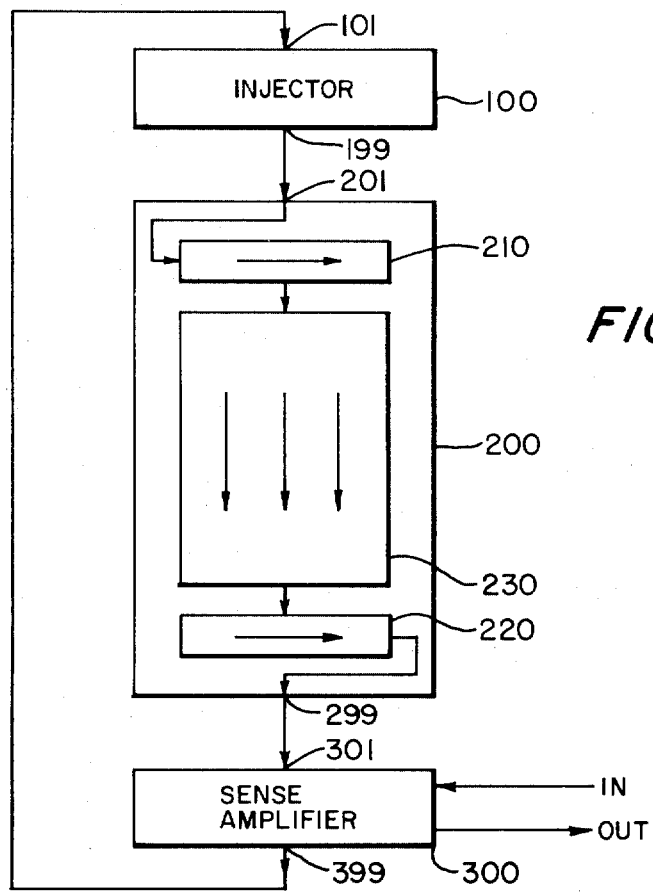
FIG. 1 is a block diagram of an SPS CCD register system with an associated injector and sense amplifier.

Referring now to FIG. 1, a block diagram of a CCD register storage system is shown. All of the components in the CCD register storage system are integrated within a single semiconductor chip which may contain a plurality of such register systems. (For additional details, see Related Application No. 6). It is noted that a single line connecting various blocks within FIG. 1 may represent a plurality of connecting leads. Also, the unconnected arrowheads in FIG. 1 represent direction of flow of information bits. The basic element of FIG. 1 is Block 200 which represents a series-parallel-series (SPS) register. SPS register 200 is comprised of three units: input serial register 210, output serial register 220 and central storage register 230. The input terminal 201 of register 200 is effectively the input terminal to input serial register 210. Bits of information in the form of charge packets are injected into section 210 and are serially propagated through section 210. CCD sites (or cells) comprising section 210 are also connected to central section 230. Section 210 is coupled to section 230 via a row of gates which allow parallel transfer of information into central section 230. Information bits are then propagated through the lengthwise section of central section 230. In the preferred embodiment, central section 230 is eight bits wide by 32 effective-bits long, thereby providing a 256-bit shift register. The arrows inside of section 230 represent the parallel propgagation of information through section 230. At the other (output) end of section 230, the information bits in the form of charge packets are transferred into output serial section 220. Upon receiving the information bits, output section 220 transfers the bits serially to the output section output terminal, which is effectively the output terminal 229 of SPS register 200.

SPS register 200 receives, transfers, and transmits information in the form of small packets of charge in the order of 50 to 230 $\times 10^{-15}$ Coulombs. Clearly, these charges are not of a level equivalent to logic signals at a system level. Accordingly, the register must be buffered in order to handle and transmit appropriated input and output signals. (Inventions directed to such buffering and conversion problems are described in Related Application Nos. 3, 4 and 5.)

The packets of charge emitted from SPS register 200 must be sensed and amplified, i.e. refreshed, before further propagation. Additionally, they must be converted to appropriate logic levels before they can be bused to other system components. This is accomplished by sense amplifier 300 which has its input terminal 301 coupled to the output terminal 299 of SPS register 200. Amplifier 300 must be highly sensitive to be able to sense the very small packets of charge after they have been transferred through and decayed within the shift register 200. It is also desirable to periodically perform a conventional refresh of the information bits stored in the register 200. This is performed by simply serially shifting the packets of charge from the register to the amplifier, and reinjecting them after they have been amplified. This operation is identical to a READ operation with the exception that the latter also entails busing the information, at a logic (MOS) level, to other system components. Such output busing is done over output line OUT shown in FIG. 1.

Input busing may be done via line IN to amplifier 300. Accordingly, in this CCD storage system, amplifier 300 is considered to include interface circuitry responsive to signals for directing the flow of information through the system to perform REFRESH, READ and WRITE operations.

An output terminal 399 of amplifier 300 is also connected to the input terminal 101 of injector circuit 100, thereby forming an input path to register 200. Injector 100 acts to convert the system level signals into appropriate charge packets. These charge packets are then transferred from the output terminal 199 of injector circuit 100 to the input terminal 201 of register 200. (For detailed description of multiphase SPS registers, see Related Application Nos. 1 and 2.)

Figure 2:
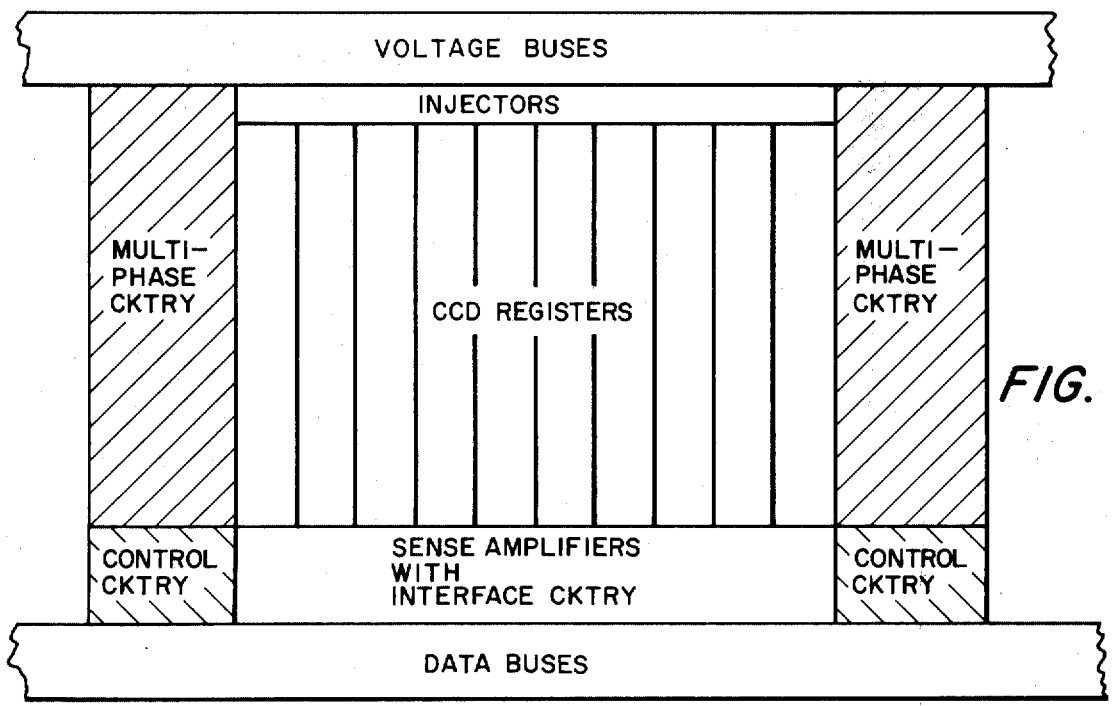
FIG. 2 is a block diagram of an embodiment of an array comprised of a plurality of CCD registers such as those shown in FIG. 1.

Referring now to FIG. 2, a configuration for a single array comprised of a plurality of CCD registers is shown. In the preferred embodiment of the invention, each array comprises 10 registers; however, those of ordinary skill in the art will readily recognize that alternate numbers of registers are possible depending on the particular system and requirements thereof. Each of the CCD storage registers requires an associated injector circuit, an associated sense amplifier and associated interface circuitry, which are also shown in FIG. 2.

In addition to the 10 registers and related circuitry, each array is also comprised of two sets of multiphase drivers for driving the 10 registers and related circuitry in parallel. Each array is also comprised of control and address circuitry and is coupled to voltage and data buses. As can be seen in FIG. 2, optimal configuration of the components required for and associated with each array is essential for achieving high density. In the preferred embodiment of the invention, each array is approximately 60 ×90 mils. Since the effective storage area within the registers comprising each area is about 2052 mil$^2$, the configuration shown in FIG. 2 utilizes about 38% (2052/5400) of the required area for storage, which is a relatively high density utilization rate.

Figure 3:
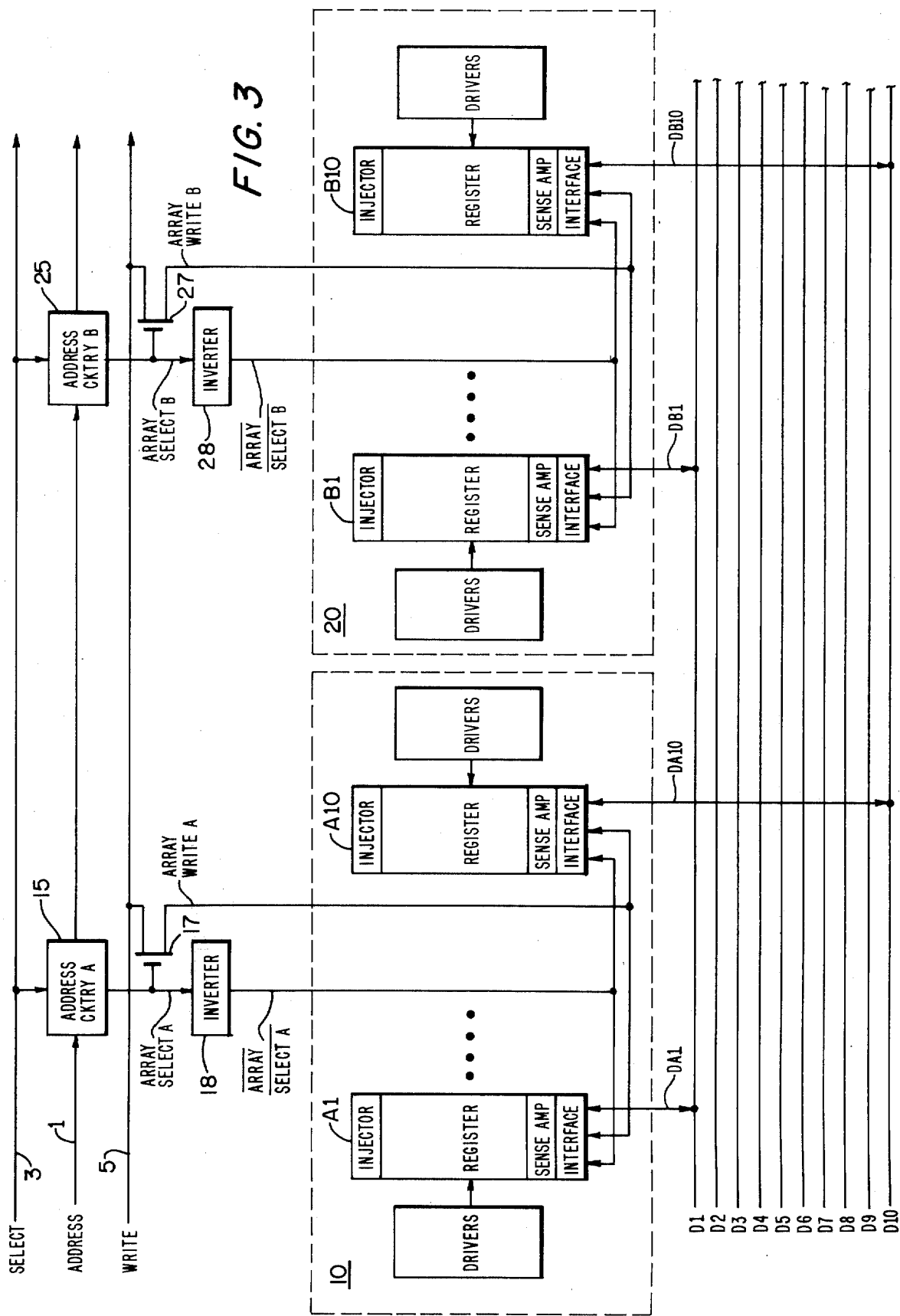
FIG. 3 is a diagram of the arrays shown in FIG. 2 with associated address circuitry and data buses shown in additional detail.

Referring now to FIG. 3, arrays comprised of a plurality of CCD registers such as those described above and associated addres circuitry are shown in another perspective. Once again it is noted that in the preferred embodiment of the invention, each array comprises 10 registers, and each of the CCD storage registers requires an associated injector circuit, an associated sense amplifier and associated interface circuitry. Accordingly, hereinafter the term "register system" is used to refer to the combination of a CCD register and these associated devices. Accordingly, array 10 of FIG. 3 is comprised of 10 register systems, A1 to A10. Similarly, array 20 is comprised of 10 register systems, B1 to B10. There may be a multiplicity of arrays so aligned on a chip, the precise number of which is dependent upon the size of the chip (and other factors). Common data buses are used to bus data in and out of all of the arrays 10, 20 etc. If bidirectional data buses are used, requirements for data buses will be only one half as great when uni-directional buses are used. This has clearly beneficial effects with respect to density. Accordingly, each of the data buses is assumed to be bidirectional. If only one array is selected for operation at any one time, the data buses will carry logic signals corresponding to data bits to or from only one array at a time, despite the fact that a muliplicity of arrays are connected to the data bus. Although only one array is addressed at any one time, all of the register systems comprising that array simultaneously transmit or receive data when the array is selected. Accordingly, since there are 10 register systems in each of the arrays, there is a requirement for 10 data buses, D1 to D10, to carry data in parallel to and from the 10 register systems. In FIG. 3, data bus D1 is coupled via data bus DA1 to register system A1, via DB1 to register system B1, etc. Similarly, data bus D10 is coupled via data bus DA10 to register system A10, via data bus DB10 to register system B10 etc.

In order to determine which array is to be selected for I/O operation, address circuitry is required. Each array has associated with it unique address circuitry, address circuitry 15 being associated with array 10, address circuitry 25 being associated with array 20, etc. An address signal ADDRESS is bused via line 1 serially to the address circuits for all of the arrays. The output signal from each of the address circuits is a signal called ARRAY SELECT. For address circuitry A, the signal is ARRAY SELECT A, for address circuitry B, the signal is ARRAY SELECT B etc. The arrays also receives in parallel a WRITE signal over line 5, and a SELECT signal over line 3. The WRITE signal is couple to array 10 via a transistor 17 and to array 20 via transistor 27 etc. The gates of these transistors 17, 27 are coupled to the appropriate ARRAY SELECT signal; the gate of transistor 17 is coupled to ARRAY SELECT A, the gate of transistor 27 is coupled to ARRAY SELECT B. In this manner, the mutual occurrence of an ARRAY SELECT signal and a WRITE signal results in an ARRAY WRITE signale for the selected array. In the preferred embodiment, the interface circuitry is designed to be responsive to $\overline{\text{ARRAY SELECT}}$ signals. Accordingly, the ARRAY SELECT signals are passed through inverters 18, 28 to generate $\overline{\text{ARRAY SELECT}}$ signals. Both the $\overline{\text{ARRAY SELECT}}$ and ARRAY WRITE signals are sent to all 10 of the register systems comprising the array; $\overline{\text{ARRAY SELECT}}$ A and ARRAY WRITE A are bused to each of the register systems A1 to A10 of array 10, $\overline{\text{ARRAY SELECT}}$ B and ARRAY WRITE B are bused to each of register systems B1 to B10 of array 20.

Figure 4A:
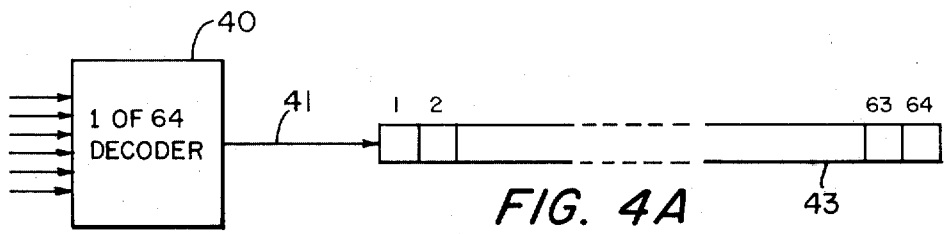
FIGS. 4A ad 4B are diagrams illustrating two embodiments of serial addressing systems.
Figure 4B:
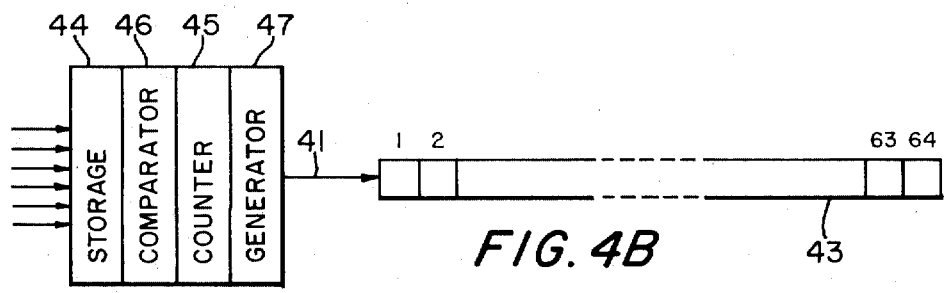

Referring now to FIG. 4A and 4B, alternate embodiments of serial addressing schemes for arrays are shown. In the addresssing scheme, N arrays may be addressed serially, and it is preferable to have N equal $2^x$ (where X is some integer power). In the preferred embodiment, shown in FIGS. 4A ad 4B, N is 64 (X=6). It will be readily apparent to those of ordinary skill in the art that alternate values for N may be substituted without deviating from the spirit and scope of the present invention. Since N equals 64, six parallel input lines are required to decoder 40. Data is transmitted simultaneously over the six lines to decoder 40 which is a 1-of-64 decoder. Output from decoder 40 is sent over line 41, which carries 64 bits serially, that is one at a time. These 64 bits will contain 63 0 bits and a single 1 bit. The position of the 1 bit will determine the array which is to be selected. A 1-of-64 decoder is shown as block 40 in FIG. 4A and may be readily constructed by one of ordinary skill in the art, as it simply requires conversion from six parallel bits to 64 serial bits multiplexed over time. The 64 bits are sequentially fed into 64-bit address shift register 43. At the end of the transmission of the 64 bits, the first bit transmitted will be in the furthermost bit position of register 43, which is labeled position 64 in FIG. 4A, the last of the 64 bits wil be in the bit position labeled 1, and the 1 bit will be in just one of the 64 bit positions. In this manner, serial address register 43 will contain 63 zero bits and a single one bit. The position of the one bit corresponds to the array which is to be selected.

An alternate embodiment for providing one bit in the address shift register 43 corresponding to the array to be addressed is to generate a one bit followed by a string of zero bits. This data stream is then shifted through the shift register 43 (which must first be initialized with zeros) until it reaches a position corresponding to the array position which is to be addressed. Accordingly, in FIG. 4B, the six parallel input lines are simultaneously fed into a storage register 44. A bit generator 47 sends a 1 bit followed by a string of 0 bits over line 41. At each time corresponding to the generation of a bit, a counter 45 is incremented by one. A comparator 46 compares the value held in counter 45 to the value held in register 44. When these are equal, the bit generator is halted. In this manner, the one bit has been serially propagated through the address shift register to the position corresponding to the array to be addressed.

Figure 5:
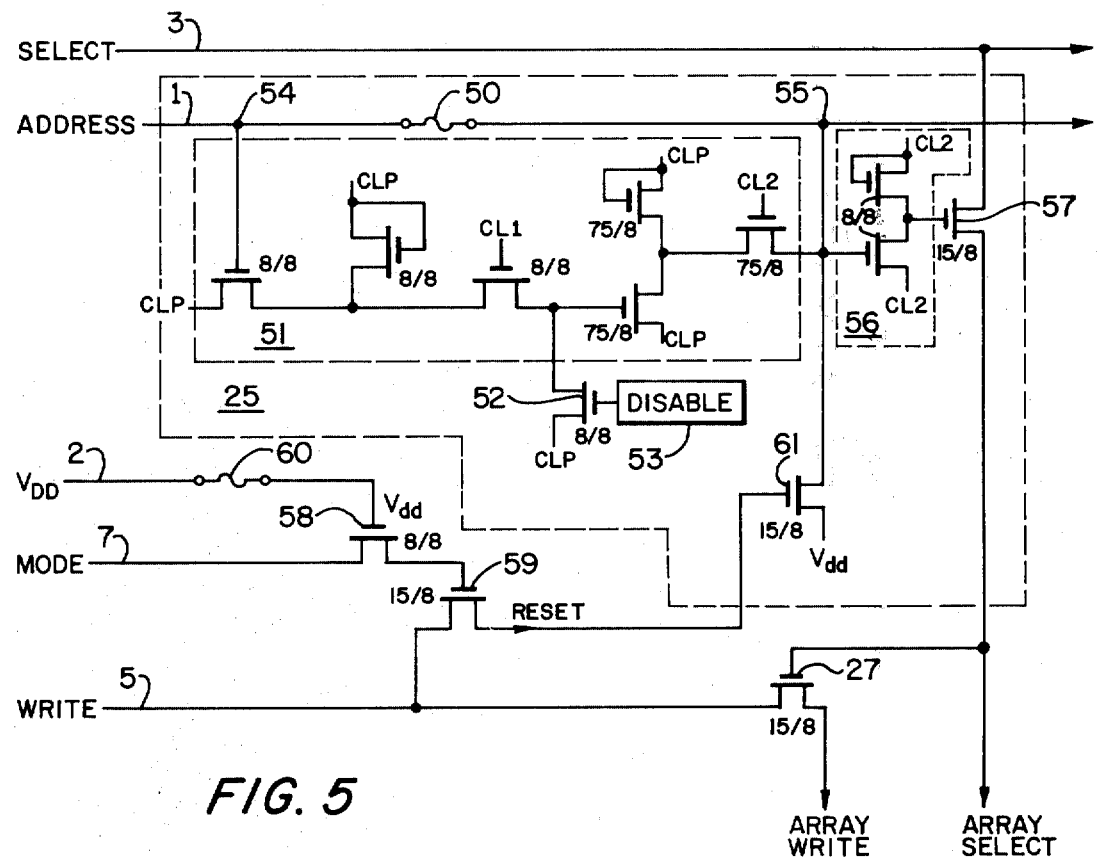
FIG. 5 is a preferred embodiment of a circuit for effecting a fault-tolerant addressing system.

Referring now to FIG. 5, address circuitry for array B, assumed to be the second array in a chain of 64, is shown. Address circuitry is identical for each of the 64 arrays. The address circuitry includes components which corresponds to each bit of the address shift register. In this manner, the serial address is propagated along the ADDRESS line 1 (of FIG. 3) through each working array. Each of the address circuits for the arrays propagates the address bit-by-bit to the next array address circuit. In this manner, each of the cells (which comrpise register 43 shown in FIGS. 4A ad 4B) correspond to an address circuitry for an array. Specifically, the components within the dotted line labeled 51 correspond to a one-bit storage cell. Since array B is assumed to be the second array in the chain, address circuit 25 corresponds to bit position number 2 of address register 43 of FIGS. 4A and 4B. A serial address is transmitted on the ADDRESS line, line 1, through bit storage cell 51 and then on through line 1 to the next address circuit.

After an address has been inserted into an address register comprised of the bit cells 51 of the address circuits of 64 arrays, the SELECT line 3 may be enabled. The SELECT line 3 carries signals in parallel to all of the address circuits. However, only the array which has the 1 stored in its address circuit will have an ARRAY SELECT signal sent to its register systems. The SELECT signal is coupled to a terminal of transistor 57. Inverter 56 is coupled to the gating terminal of transistor 57. When a 1 is stored in cell 51, inverter 56 will enable transistor 57; when a 0 is in cell 51, transistor 57 will not be enabled. In this manner, the SELECT signal is appropriately gated to obtain the ARRAY SELECT signal. The ARRAY SELECT signal is also used to enbable transistor 27. In this manner, the WRITE line which is bused in parallel to all of the arrays is appropriately gated to obtain the ARRAY WRITE signal.

If the addressing scheme described in conjuction with FIG. 4B is used, a reset function must also be provided by the address circuitry. When a first address is inserted into the address register, the 1 will be in some position, for example, position 22. When a second address is required to be inserted into the address register, care must be taken to assure that the first 1 bit does not interfere with proper addressing operation. If the second address is greater than 22, for example, for position 25, mechanisms may be provided to simply propagate the first 1 bit by three positions. Alternately, the address register could be reset (to all zeros), and a new 1 could be sent all the way to position 25. If, however, the second address is less than 22, for example, for position 7, the address register must be reset and a new serial bit stream is then inserted into the address register. The RESET signal is provided by transistor 59 to reset transistor 61. Transistor 61, when enabled, brings point 55 to $V_{dd}$ which is equivalent to a 0. This acts to propagate a 0 from cell 51 even if a 1 had been stored in cell 51. Transistor 61 is enabled by a signal from transistor 59, which acts as an AND gate for the WRITE and MODE signals over lines 5 and 7 respectively. Other embodiments are possible wherein other signals are used to generate the RESET signal. It is noted that the MODE signal on line 7 is conditionally passed to transistor 59 through transistor 58. TRansistor 58 is enabled only when fuse 60 is intact, i.e. the fuse 60 is not blown and provides a short circuit. $V_{DD}$ is bused to the arrays via a voltage bus, but conditionally provided to each array depending on the status of fuses 60. This is for purposes of achieving better performance in conjunction with the fault-tolerance of the chips, and is described in additional detail below and in Related Application No. 6.

The chain selection scheme embodied in the present invention can be modified such that it is not required that every array on chips comprising a memory module be properly functioning. In fact, chips may contain malfunctioning arrays. The addressing system may be made fault-tolerant so that it is possible to utilize chips which contain some (reasonable) percentage of malfunctioning arrays. This can provide for significant cost economies in processing of chips. What is required to achieve fault-tolerance is (1) to identify which arrays are malfunctioning and (2) to prevent such arrays from occupying what corresponds to a bit position within the serial address register for the serial address. This can be accomplished if malfunctioning arrays are removed from the 64-bit address register for the serial address. Chain fuse 50 of FIG. 5 in combination with the disable pad 53 provides the capability for effecting the above-required functions.

Disable pad 53 enables the coupling of the half-bit point of cell 51 via transistor 52 to clock CLP. During manufacture of chips, tests may be performed to determine which of the arrays are properly functioning. An enabling (low) signal is sent to all of the DISABLE pads on a chip except for an isolated array to be tested. This has the effect of forcing the cells 51 to appear as if a 0 has been stored in them. In this manner, only the particular array under test will be responsive to control signals and its operation may be checked. If the array is found to be properly functioning, then it is desired to have its cell 51 included as a bit within the serial address register. Accordingly, metal fuse 50 which connects point 54 to point 55 (the input and output nodes respectively of cell 51) must be opened. This may be done by any process such as laser burning into the fuse 50 so as to remove the shorted path between points 54 and 55. If the array is found to be malfunctioning, metal fuse 50 is left in the circuit. In this manner, ADDRESS line 1 is shorted from point 54 to point 55 and a signal over ADDRESS line 1 does not pass through that one-bit storage cell 51. This corresponds to removing the address circuit for the array from the serial address register. When an array is malfunctioning it is also desirable to save power and minimize signal transmission by disabling the entire operation of that array. Accordingly, (metal) fuse 60 which couples the voltage bus for $V_{DD}$ to the array is also opened. This feature and its effect is described in detail in Related Application No. 6.

Figure 6:
FIG. 6 is a timing diagram showing the timing relationships if the phases used to drive the address circuit of FIG. 5.
Figure 6:
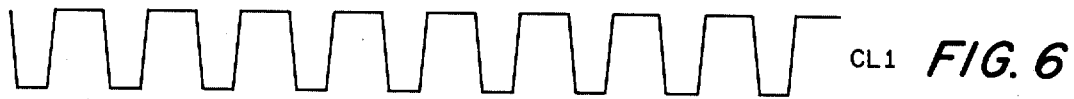
Figure 6:
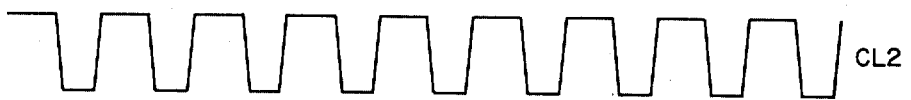

Referring now to FIG. 6, the phase relationships of the clocks used to drive the address circuit are shown. Clock P is a 2 MHZ clock and clocks 1 and 2 are 1 MHZ clocks. Clocks 1 and 2 are 180° out of phase with respect to each other, and are phase-related to clock P.

In the preferred embodiment, 64 arrays are simultaneously addressed. In this manner, information may be transmitted to or from only one of these 64 arrays at any one time. However, all 64 arrays may have identical contrl circuitry and use the same data buses: they are operated simultaneously but only one will require usage of the buses at any one time. It is further noted that it is not required that all 64arrays found on the same chip as long as connections between chips are provided.

A fault-tolerant chain selection scheme is provided and embodied within simplified address circuitry which requires a minimum of space so as to provide high-density CCD memory chips. Design trade-offs have been consistently made in favor of higher density at the cost of speed, since practical applications of CCDs place a premium on density, not speed.

In the preferred embodiment, all transistors are MOSFET transistors. Accordingly, low signals enable the transistors and high signals turn the transistors off. In the diagrams, sizes for the transistors are given in terms of surface area of a semi-conductor chip. The sizes are shown as width over length ($w/l$) in microns and are not in anyway meant to be restrictive as alternate geometries may be employed to the same effect.

The scope of the invention is to be limited only by the following claims. From the above discussion, many variations will be apparent to one skilled in the art that would yet be encompassed by the spirit and scope of the invention.

What is claimed is:

1. An addressing system for $k$ arrays of CCD registers wherein at least a one of said register arrays can contain a fault condition, said system responsive to a serial address signal and control signals for selecting and enabling a one of said arrays not having a fault condition, said system comprising;
   $k$ storage means, each of said storage means being associated with a one of said $k$ arrays, wherein each of said storage means can store a data signal
   busing means serially coupling and applying said address signal to said $k$ storage means, said busing means including means coupled to each of said storage means for electrically by-passing said coupled storage means; each of said electrically by-passing means being inactivated when no fault condition is present in said associated array, wherein storage means with no fault condition forms a shift register, said shift register receiving and storing a signal determined by said serial address signal; and
   selection means coupled between each of said storage means and said associated register array, each of said selection means responsive to said stored data signal in said coupled storage means for generating a first array signal for enabling said coupled array.

2. The system of claim 1 further comprising $k$ signal means each coupled to an associated array for generating second array signals for enabling said associated array to operate in a WRITE mode of operation in response to first control signal and said first array signal.

3. The system of claim 2 wherein each of said signal means comprises a transistor with its gating terminal coupled to receive said first array signal.

4. The system of claim 1 wherein each of said selection means comprises an inverter coupled to an output node of said one storage means.

5. The system of claim 4 wherein each of said selection means further comprises a transistor coupled to receive a second control signal, said transistor having its enabling terminal coupled to said inverter.

6. The system of claim 1 further comprising reset means coupled to output nodes of said storage means, said reset means responsive to a third control signal for forcing output signals from said storage means to be a predetermined data signal.

7. The system of claim 6 wherein said reset means comprises a reset transistor having one of its terminals coupled to a voltage corresponding to a predetermined signal level and the other of its terminals coupled to said output nodes, said reset transistor having its enabling terminal responsive to said third control signal.

8. The system of claim 6 wherein said reset means comprises reset transistors each having one of its terminals coupled to a voltage corresponding to a predetermined signal level and the other of its terminals coupled to one of the said output nodes, each of said reset transistors having its enabling terminal responsive to said third control signal.

9. A fault-tolerant addressing system for arrays of CCD registers, said system responsive to a serial address signal and control signals for selecting and enabling one of said arrays, said system comprising;
   storage means associated with each of said register arrays, wherein each of said storage means in capable of storing at least one bit of data;
   busing means serially coupling and applying said serial address signal to said storage means by coupling an output node of each storage means with an input node of a succeeding storage means;
   shorting means electrically coupling input nodes to output nodes respectively of each of said storage means, said shorting means preventing said coupled storage means from receiving said serial address signal, wherein said shorting means can be disabled combination of said storage means, said busing means and disabled shorting means forming a shift register of said storage means; and
   selection means each responsive to said data stored in a corresponding one of said storage means for generating a first array signal, said first array signal enabling an array corresponding with said one storage means, said stored data determined by said serial address signal applied to said storage means shift register.

10. The system of claim 9 further comprising:
    disabling means responsive to external signals each coupled to a corresponding one of said storage means for inhibiting the storage of a predetermined data signal in said one storage means, whereby said one storage means may be disabled and the other of said storage means may be individually activated.

11. The system of claim 9 wherein said shorting means comprise breakable fuses providing circuit paths between input and output nodes of said storage means.

12. The system of claim 9 further comprising signal means coupled to each of said selection means, said signal means repsonsive to a first external control signal and to a one of said first array signals from said corresponding selection means for generating a second array signal for enabling said one array to operate in a WRITE mode of operation.

13. The system of claim 12 wherein each of said signal means comprises a transistor with its gating terminal coupled to receive said one of said first spray signals.

14. The system of claim 9 wherein each of said selection means comprises an inverter coupled to an output node of said one storage means.

15. The system of claim 14 wherein each of said selection means further comprises a transistor coupled to a second control signal, said transistor also coupled to and enabled by said inverter.

16. The system of claim 9 further comprising reset means coupled to output nodes of said storage means, said reset means responsive to a third control signal for forcing output signals from said storage means to be predetermined data signals.

17. The system of claim 16 wherein said reset means comprises a reset transistor having one of its terminals coupled to a voltage corresponding to a predetermined level and the other of its terminals to said output nodes, said reset transistor having its gating terminal responsive to said third control signal.

18. The system of claim 16 wherein said reset means comprises reset transistors each having one of its terminals coupled to a voltage corresponding to a predetermined level and the other of its terminals coupled to one of the said output nodes, said reset transistors having its gating terminal responsive to said third control signal.

19. A fault-tolerant addressing circuit for an array of CCD storage registers responsive to a serial address signal and external control signals, said circuit comprising:

storage means including a plurality of storage cells for storing data signals determined by said address signal, each of said storage cells being associated with a register array;

shorting means coupled to an input node and an output node of said storage means, said shorting means receiving said address signal when said register array is properly functioning and providing an address signal by-pass register when said associated array is malfunctioning; and selection means coupled to each of said storage means and to said associated register array, said selection means responsive to a data signal stored in said storage means for generating a first array control signal said first array control signal enabling said associated register array.

20. The circuit of claim 19 wherein said shorting means comprises breakable fuses.

21. The circuit of claim 19 further comprising signal means for generating a second array control signal for enabling a WRITE mode of operation of said array, said signal means coupled to receive a first control signal and enabled by said first array control signal.

22. The circuit of claim 19 wherein said selection means comprises an inverter coupled to said output mode.

23. The system of claim 22 wherein each of said selection means further comprises a transistor coupled to receive a second control signal, said transistor having its enabling terminal coupled to said inverter.

24. The circuit of claim 19 further comprising reset means coupled to said output node and responsive to a third control signal for forcing output signals from said storage means to be a predetermined logic signal.

25. The circuit of claim 24 wherein said reset means comprises a reset transistor having its terminals coupled to a voltage corresponding to a predetermined logic level and to said output node, said reset transistor enabled by said third control signal.

26. The circuit of claim 19 further comprising disabling means coupled to said storage means for preventing the storage of a second predetermined logic level in said storage means.

* * * * *